(12) United States Patent
Park et al.

(10) Patent No.: US 6,297,153 B1
(45) Date of Patent: *Oct. 2, 2001

(54) METHOD OF MANUFACTURING BARRIER METAL FILM OF SEMICONDUCTOR DEVICE AND METHOD OF MANUFACTURING METAL INTERCONNECTION FILM OF SEMICONDUCTOR DEVICE USING THE SAME

(75) Inventors: Jong-min Park, Kyungki-do; Sang-woo Lee, Seoul; Byoung-ju Yoo, Kyungki-do, all of (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/185,089

(22) Filed: Nov. 3, 1998

(30) Foreign Application Priority Data

Feb. 24, 1998 (KR) .................................................. 98-5807

(51) Int. Cl.[7] .................................................. H01L 21/44
(52) U.S. Cl. .......................... 438/653; 438/627; 438/643
(58) Field of Search .................................. 438/653, 656, 438/627, 649, 626, 643, 128, 426; 204/192; 257/766

(56) References Cited

U.S. PATENT DOCUMENTS

| 4,942,137 | * | 7/1990 | Sivan et al. | 438/426 |
| 4,963,239 | * | 10/1990 | Shimamura et al. | 204/192 |
| 5,162,262 | * | 11/1992 | Ajika et al. | 438/649 |
| 5,254,872 | | 10/1993 | Yoda et al. . | |
| 5,256,491 | * | 10/1993 | Ishida et al. | 428/500 |
| 5,378,660 | * | 1/1995 | Ngan et al. | 438/656 |
| 5,453,642 | * | 9/1995 | Kaja et al. | 257/766 |
| 5,622,894 | * | 4/1997 | Jang et al. | 438/643 |
| 5,705,442 | * | 1/1998 | Yen et al. | 438/653 |
| 5,783,483 | * | 7/1998 | Gardner | 438/627 |
| 5,872,053 | * | 2/1999 | Smith | 438/626 |
| 5,889,328 | | 3/1999 | Joshi et al. . | |
| 5,897,342 | * | 4/1999 | Liu et al. | 438/128 |
| 5,943,600 | * | 8/1999 | Ngan et al. | 438/653 |
| 5,989,999 | * | 11/1999 | Levine et al. | 438/627 |

FOREIGN PATENT DOCUMENTS 97-52455   7/1997   (KR) .

OTHER PUBLICATIONS

Souw et al., Nuclear Instruments & Methods in Physics Research, A 400 (1997) 69–86.*

* cited by examiner

Primary Examiner—Olik Chaudhuri
Assistant Examiner—Ginette Peralta
(74) Attorney, Agent, or Firm—Jones Volentine, L.L.C.

(57) ABSTRACT

A method of manufacturing a barrier metal film of a semiconductor device includes, after a barrier metal film is annealed, performing an oxygen-annealing in-situ immediately after the annealing. By forming the barrier metal film in this way, an amorphous oxide film is formed only at a predetermined depth from the surface of the barrier metal film, so that a junction spike caused by the diffusion of interconnection material into the barrier metal film can be effectively prevented. This method of manufacturing may also be used when manufacturing an interconnection film of a semiconductor device.

13 Claims, 8 Drawing Sheets

METHOD OF MANUFACTURING BARRIER METAL FILM OF SEMICONDUCTOR DEVICE AND METHOD OF MANUFACTURING METAL INTERCONNECTION FILM OF SEMICONDUCTOR DEVICE USING THE SAME

This application claims priority under 35 U.S.C. §119 to Korean Application No. P98-5807, the entire contents of which are hereby incorporated by reference.

BACKGROUND OF THE INVENTION

1. Field of the Invention

The present invention relates to a method of manufacturing a semiconductor device and the device formed thereby, and more particularly, to a method of manufacturing a barrier metal film of a semiconductor device, a method of manufacturing a metal interconnection film using the same and the apparatus formed thereby.

2. Description of the Related Art

A semiconductor device of a highly integrated circuit is constituted of various circuit patterns formed of various materials on a semiconductor substrate. Each circuit pattern is formed of a conductive semiconductor material such as impurity-doped silicon (Si) or a metal interconnection material such as aluminum (Al), platinum (Pt), copper (Cu) or tungsten (W). The circuit patterns formed of various materials are electrically connected via contact holes to constitute a circuit.

Here, in order to stabilize the interface between the contacting circuit patterns formed of different materials, a barrier metal film is necessary to prevent diffusion between the different materials, or a chemical reaction. Generally, a barrier metal film is formed as a titanium nitride (TiN) film, a tantalum nitride (TaN) film, a titanium silicide nitride (TiSiN) film or a tantalum silicide nitride (TaSiN) film. The barrier metal film must maintain a high conductivity, stably prevent diffusion, and be thermally stable.

However, many defects or microcracks are likely occur within a barrier metal film, which are concomitant phenomena of the step of forming a barrier metal film. Thus, material forming an interconnection film formed on the barrier metal film diffuses through the defects or microcracks of the barrier metal film, to reach the semiconductor substrate, thereby forming a junction spike. The electrical characteristics of the contact are deteriorated by such a junction spike, thereby increasing junction leakage current level. As a result, product yield and reliability are lowered.

SUMMARY OF THE INVENTION

To solve the above problems, it is an object of the present invention to provide a method of manufacturing a barrier metal film which more effectively prevents diffusion.

It is another object of the present invention to provide a method of manufacturing a metal interconnection film using the method of manufacturing the barrier metal film.

To achieve the first and other objects, there is provided a method of manufacturing a barrier metal film of a semiconductor device, including forming a barrier metal film on a semiconductor substrate, annealing the barrier metal film, and in-situ oxygen-annealing immediately after the annealing.

To achieve the second and other objects, there is provided a method of manufacturing a metal interconnection film of a semiconductor device, comprising the steps of: (a) forming a contact hole which exposes an impurity region formed on a semiconductor substrate; (b) forming a barrier metal film in the contact hole; (c) annealing the barrier metal film; (d) in-situ oxygen-annealing immediately after the step (c); and (e) forming an interconnection film on the oxygen-annealed barrier metal film.

Preferably, the annealing step is performed under a nitrogen atmosphere.

Preferably, the oxygen-annealing step is performed while providing oxygen for a predetermined time, short enough that the contact resistance of the barrier metal film stays below allowable range, and long enough to form an oxide film as a diffusion barrier film on the surface of the barrier metal film.

Preferably, the annealing step and the oxygen-annealing step are performed in a batch type furnace, and the oxygen-annealing step is performed by flowing oxygen at a predetermined flow rate which allows even oxygen-annealing regardless of the loading position of the semiconductor substrate within the furnace.

Preferably, the barrier metal film is a titanium nitride (TiN) film, and the interconnection film is an aluminum (Al) film, and an ohmic contact metal film, e.g., titanium film, is further formed in the contact hole before the step of forming the barrier metal film.

When the barrier metal film and the interconnection film are formed by the methods of the present invention, an amorphous oxide film for preventing diffusion is formed on the surface of the barrier metal film, to prevent a junction spike caused by diffusion of interconnection material into the barrier metal film.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
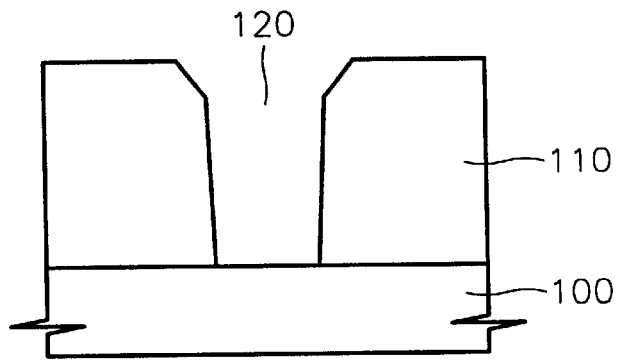
FIGS. 1 through 3 are vertical section views of intermediate structures, for illustrating a method of manufacturing a barrier metal film according to the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

According to a preferred embodiment of the present invention, the steps of forming a barrier metal film and a metal interconnection film will be described with reference to FIGS. 1 through 5.

Referring to FIG. 1, a dielectric film 110 formed on a semiconductor substrate 100 is partially etched to form a contact hole 120 which exposes an active region (not shown) of the semiconductor substrate 100.

Figure 2:
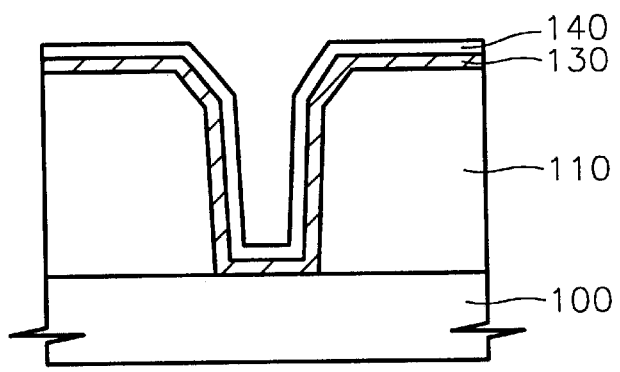

Referring to FIG. 2, a metal film 130 for ohmic contact is formed on the resultant structure having the contact hole 120 by sputtering so as to lower contact resistance. Here, the ohmic contact metal film 130 is usually a titanium (Ti) film.

Subsequently, a barrier metal film 140 is formed on the ohmic contact metal film 130 by in-situ sputtering. Preferably, the barrier metal film 140 is a titanium nitride (TiN) film or a titanium silicide nitride (TiSiN) film.

Figure 3:
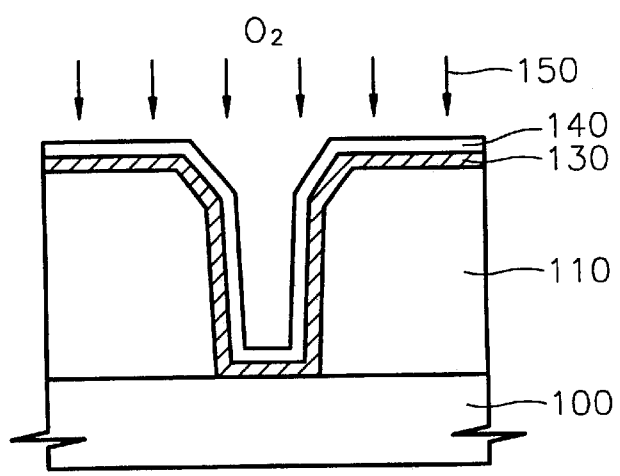
Figure 4:
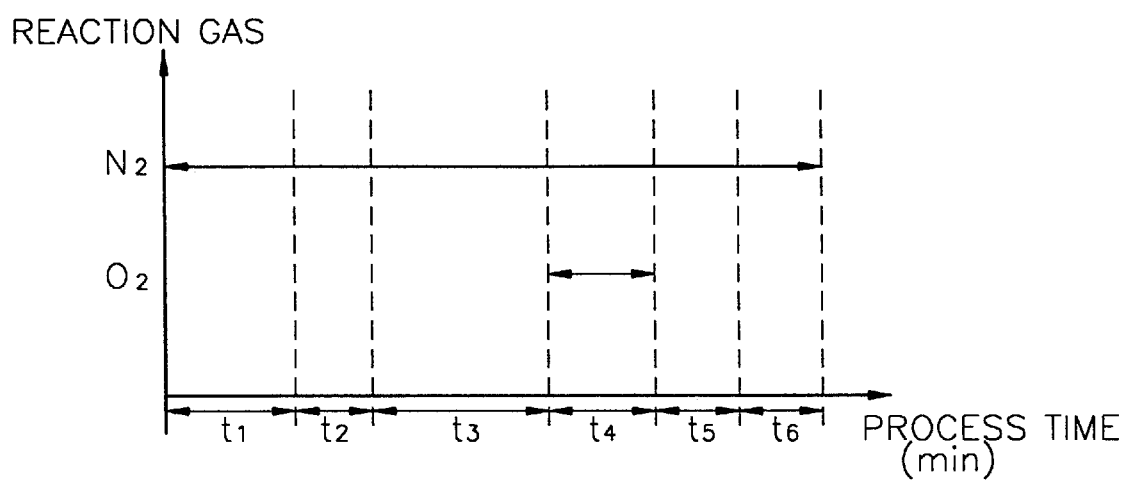
FIG. 4 is a timing graph for illustrating an oxygen-annealing step shown in FIG. 3.

Next, as shown in FIGS. 3 and 4, the barrier metal film 140 is annealed to improve the characteristics of the barrier metal film 140. An annealing process will be described with reference to FIGS. 3 and 4. First, the resultant structure of FIG. 2, having the ohmic contact metal film 130 and the barrier metal film 140, is loaded onto a batch type vertical furnace (not shown). Here, t1 is a time required for loading. The reason why the annealing is performed in the batch type vertical furnace is because the productivity is higher compared with a single wafer type chamber.

After the furnace is stabilized for a time t2, the barrier metal film 140 is annealed for a time t3. Preferably, the annealing is performed under a nitrogen atmosphere. The annealing lowers contact resistance by forming a silicide film at the interface between the ohmic contact metal film 130 and the semiconductor substrate 100. Also, the annealing improves the characteristics of the barrier metal film 140. For example, if the barrier metal film 140 is a TiN film, the atomic ratio of Ti to N can be controlled to 1:1 by annealing the TiN film under a nitrogen atmosphere. As a result, the whole TiN film is more dense and a thermally nitrided TiN thin film is formed on the surface of the TiN film, thereby improving characteristics as a barrier.

After annealing for a time t3, oxygen is supplied to the furnace for a time t4 for the oxygen-annealing. The oxygen-annealing is performed so as to form an oxide film on the surface of the barrier metal film 140. The oxide film formed on the surface of the barrier metal film 140 prevents an interconnection material from diffusing into the defects or microcracks of the barrier metal film.

Here, the oxygen is not supplied throughout the entire annealing. That is, the annealing for the time t3 is performed under nitrogen atmosphere, and the oxygen-annealing is performed for the time t4. The reason why the oxygen-annealing is performed for only the time t4 is because continuous oxygen supply throughout the annealing process oxidizes most of the barrier metal film 140 or the ohmic contact metal film 130 below the barrier metal film 140, resulting in lower conductivity. Accordingly, contact resistance with an impurity region of the silicon substrate is increased, so that it is impossible to use the device. Thus, the annealing at the initial stage is performed without oxygen, and then oxygen is provided for the oxygen-annealing after a predetermined time lapse. The time t4 for which oxygen is provided is determined such that an oxide film capable of preventing diffusion of the interconnection material is formed, while the contact resistance of the semiconductor device stays below an allowable maximum.

When the barrier metal film 140 is a TiN layer, it is preferable that the oxygen-annealing time t4 is 5~20 minutes. Here, preferably, the oxygen is supplied at a rate of 100 sccm or more such that the oxygen-annealing is uniformly performed regardless of the loading position within the furnace.

After stopping oxygen-annealing, the semiconductor substrate is held for a time t5 within the furnace before unloading. The unloading takes a time t6. That is, the total annealing time of the present invention is equal to the sum of t3, t4 and t5, and the actual oxygen supply time is equal to t4. The time t4 must be long enough to form an oxide film for preventing the diffusion of the interconnection material into the barrier metal film, without increasing contact resistance.

Figure 5:
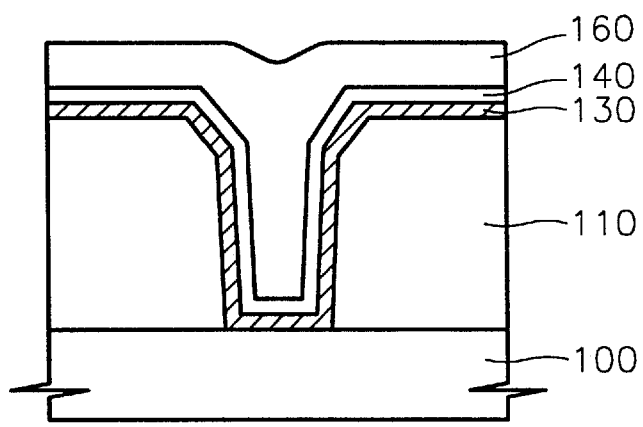
FIG. 5 is a vertical section view illustrating the step of forming an interconnection film on the oxygen-annealed barrier metal film.

Lastly, as shown in FIG. 5, an interconnection film 160 is formed on the barrier metal film which passed through the oxygen-annealing. The interconnection film 160 is formed by depositing a metal interconnection material such as Al, Pt, Cu or W.

When a barrier metal film is formed by the oxygen-annealing, the defects or microcracks of the barrier metal film are filled with oxygen, and thus a thin oxide film is formed. Thus, constituents of the interconnection film formed on the barrier metal film are not diffused into the defects or microcracks of the barrier metal film, so that the problem of a junction spike can be effectively prevented.

The present invention will be described in detail through the following examples. However, the present invention is not limited to the following examples.

In the following examples, a titanium (Ti) film is used as the ohmic contact metal film, and a titanium nitride (TiN) is used as the barrier metal film. After the oxygen-annealing is performed on the barrier metal film under various conditions, the following characteristics are measured in order to observe the effect of oxygen-annealing on the barrier metal film, that is, TiN film: reflective index, X-ray diffraction (XRD) characteristics, content analysis by Auger electron spectroscopy (AES), photomicrograph by transmission electron microscopy (TEM), and leakage current.

Annealing Process

After a plurality of semiconductor substrates are pretreated in a mixed solution containing hydroboric acid solution and hydrofluoric acid solution, a Ti film and a TiN film were deposited on the semiconductor substrate to 300 Å thickness and 900 Å thickness, respectively, by sputtering. DC power for depositing each film was set to 12 kW and 17 kW, respectively. Also, flow rates of nitrogen gas and argon gas, for forming the TiN film, were 10 sccm and 100 sccm, respectively.

Next, a plurality of semiconductor substrates having the Ti film and TiN film were classified as one of six groups. Five groups of those were annealed in a batch type vertical furnace under the conditions of Table 1. The remaining group, a reference sample, was annealed under nitrogen atmosphere without performing the oxygen annealing. During the annealing process, nitrogen gas was continuously flowed into the furnace at a rate of 15 standard liter per minute. The total annealing time means the time from the loading of a substrate onto the furnace to the unloading of the substrate, including the stabilization period between the loading and unloading of the substrate, and is equal to the sum of t3, t4 and t5 (see FIG. 4).

TABLE 1

| sample | 1 | 2 | 3 | 4 | 5 | reference sample |
|---|---|---|---|---|---|---|
| total annealing time (min) | 70 | 70 | 70 | 75 | 85 | 70 |
| oxygen flow time (min) | 5 | 5 | 5 | 10 | 20 | 0 |
| oxygen flow rate (sccm) | 30 | 60 | 100 | 30 | 30 | 0 |

Reflective Index Measurement

The reflective index of each sample was measured on each sample by using a light probe using 4800 Å A wavelength. The reflective index of a semiconductor substrate without any film was set to 100 as a reference value. Reflective index ratio (R.I. ratio) was a value obtained by dividing the reflective index of the TiN film after the annealing by the reflective index of the TiN film before the annealing. The result is shown in Table 2, and FIG. 6.

TABLE 2

| sample | 1 | 2 | 3 | 4 | 5 | reference sample |
|---|---|---|---|---|---|---|
| R.I. ratio | 1.99 | 2.10 | 2.16 | 2.15 | 2.41 | 1.82 |

Figure 6:
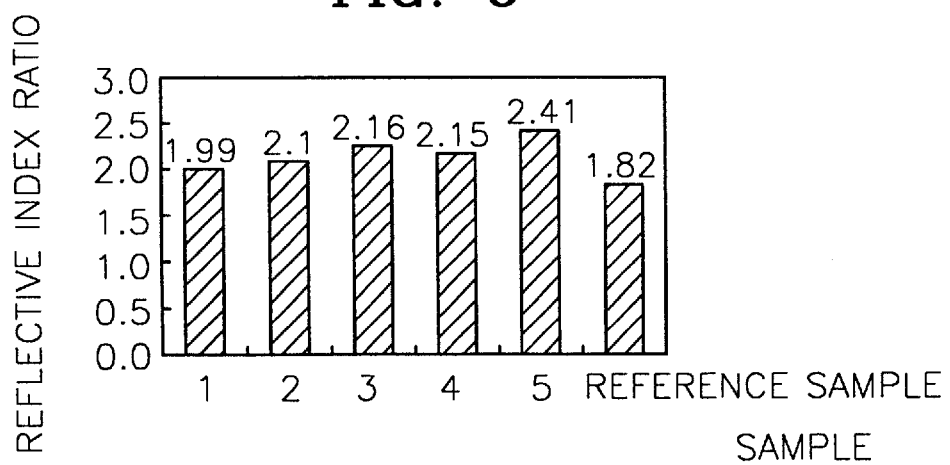
FIG. 6 is a graph showing reflective indices of five samples each of which has a Ti/TiN film and passed through the oxygen-annealing process at a different oxygen flow time and different oxygen flow rate, and of a reference sample which has a Ti/TiN film and does not pass through the oxygen-annealing process.
Figure 7:
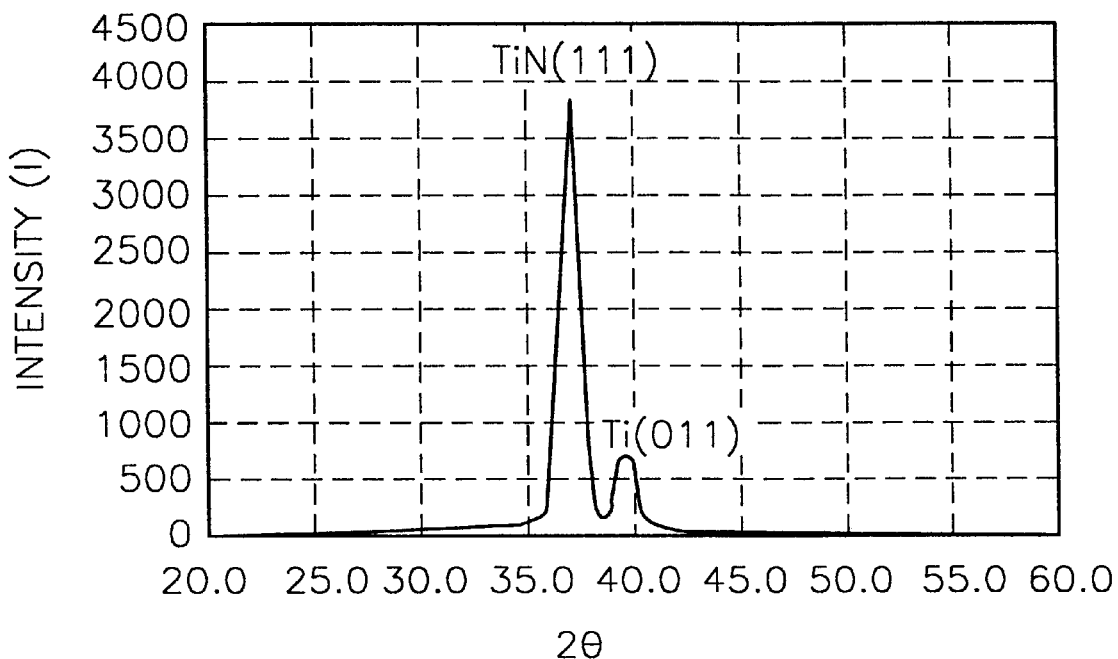
FIGS. 7 through 11 are graphs of X-ray diffraction (XRD) for the five samples of FIG. 6.
Figure 8:
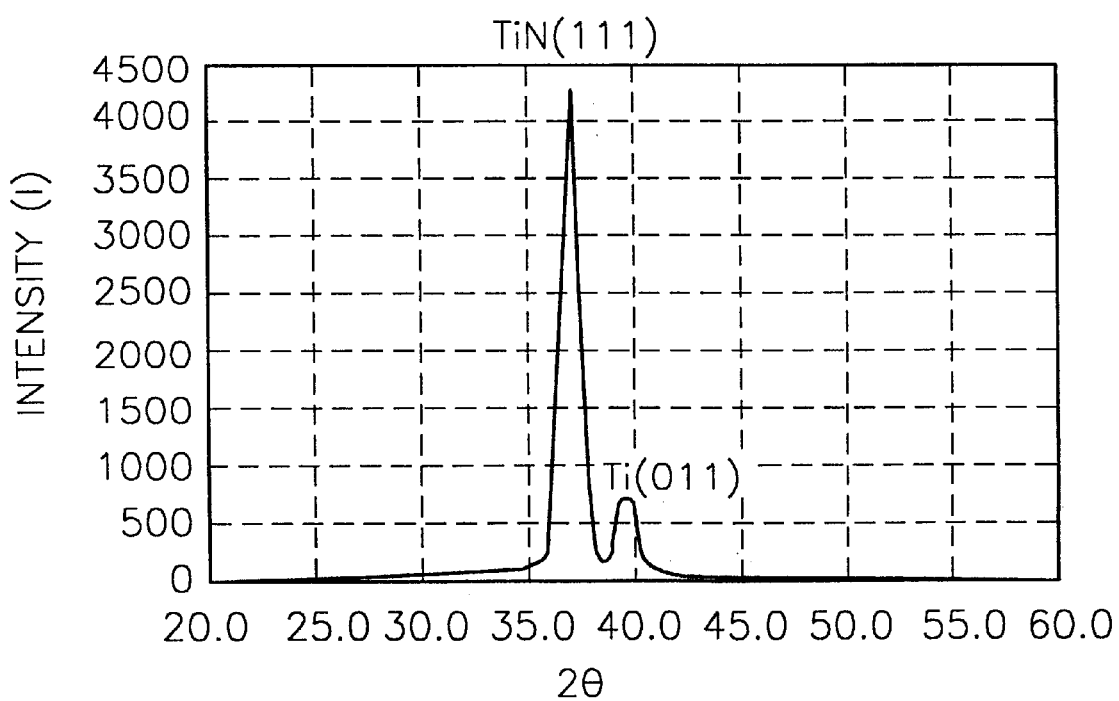
Figure 9:
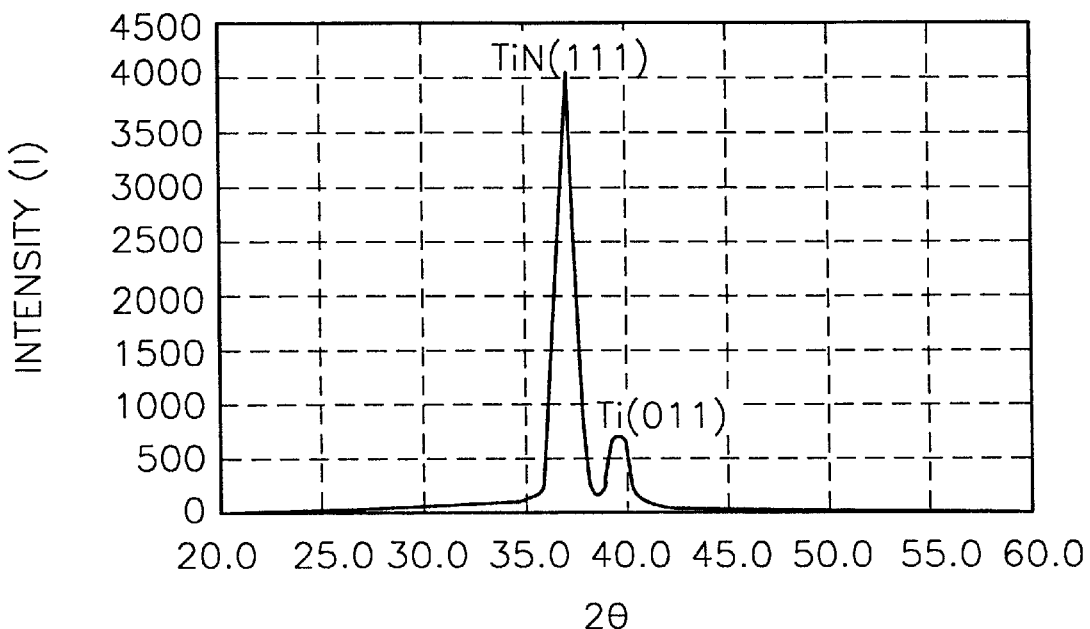
Figure 10:
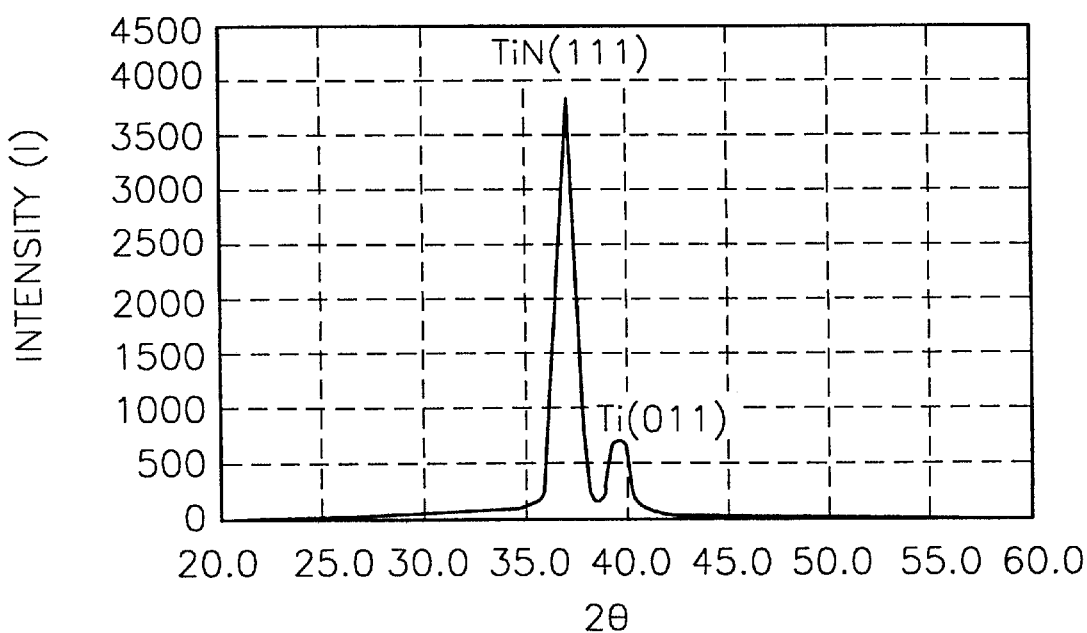
Figure 11:
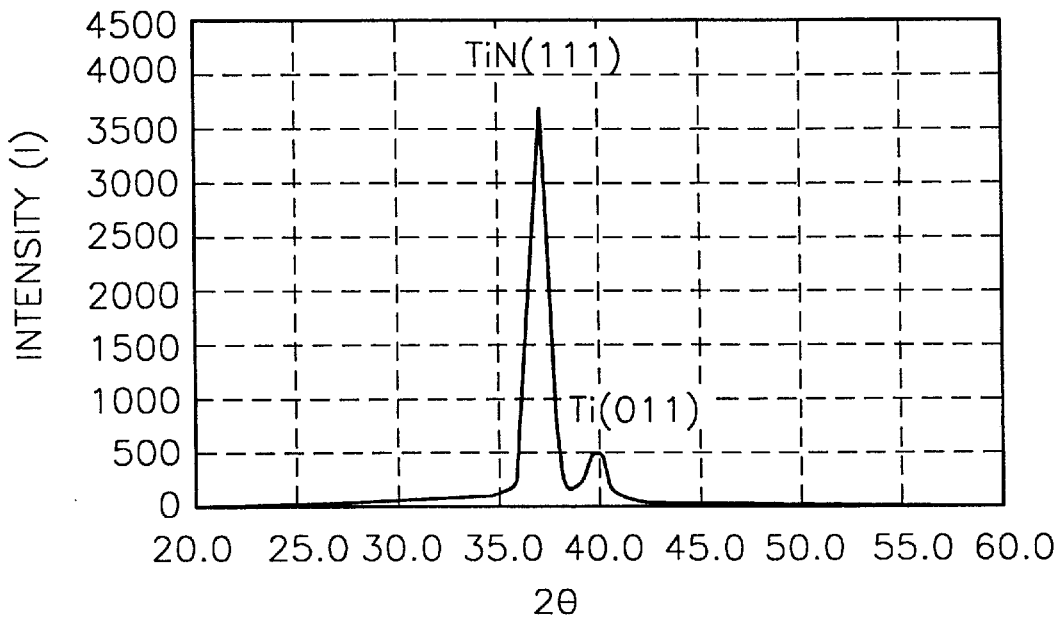
Figure 12:
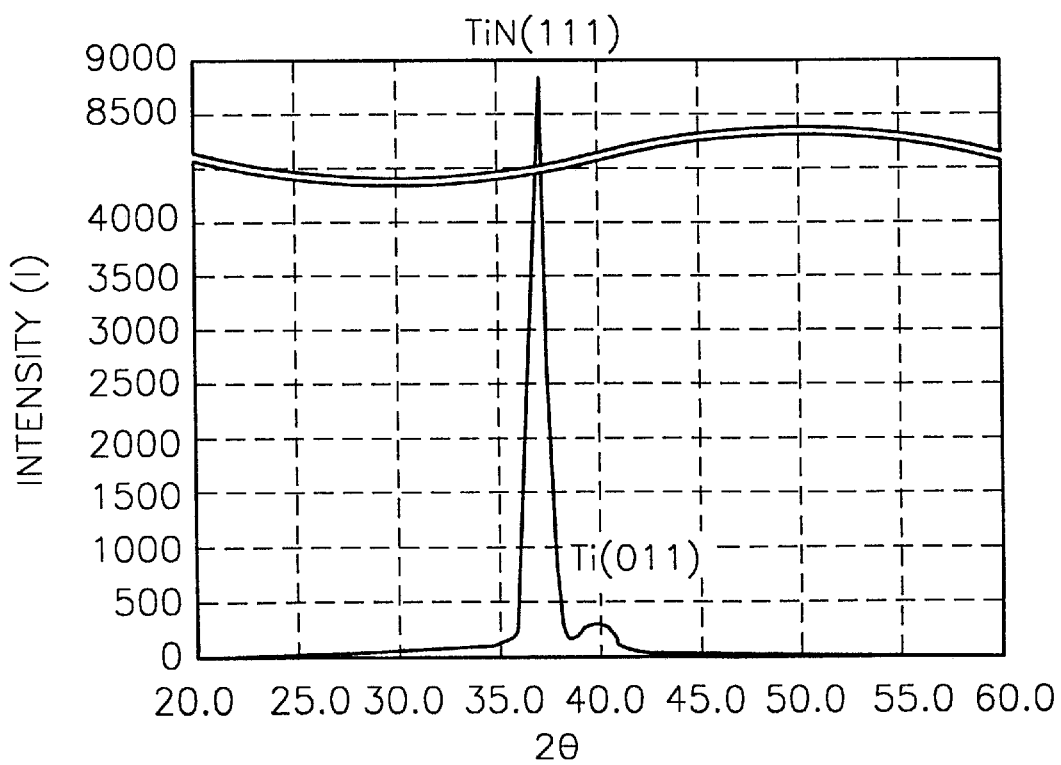
FIG. 12 is an XRD graph for the reference sample of FIG. 6.
Figure 13:
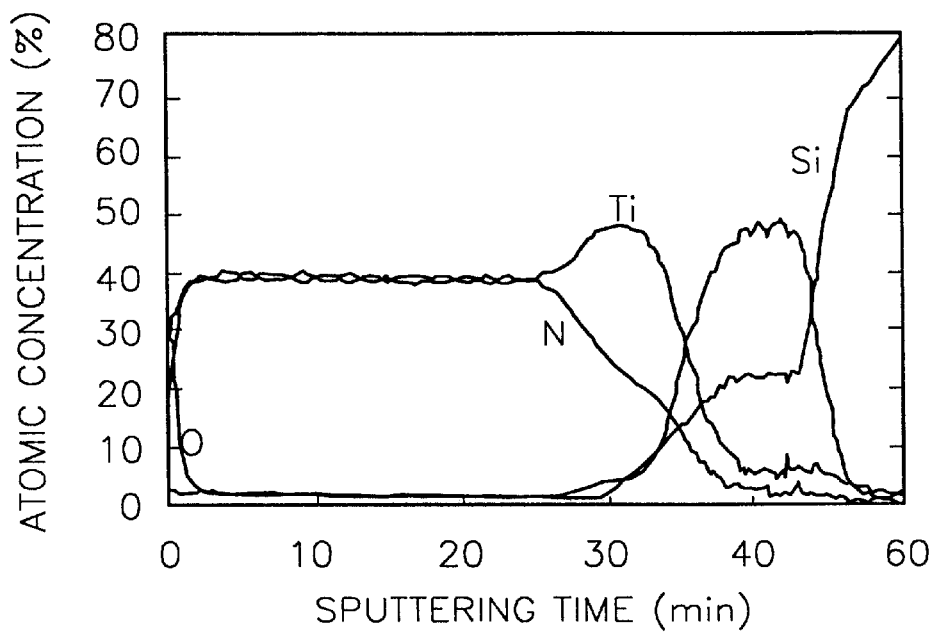
FIGS. 13 through 17 are graphs of Auger electron spectroscopy (AES) for the five samples of FIG. 6.
Figure 14:
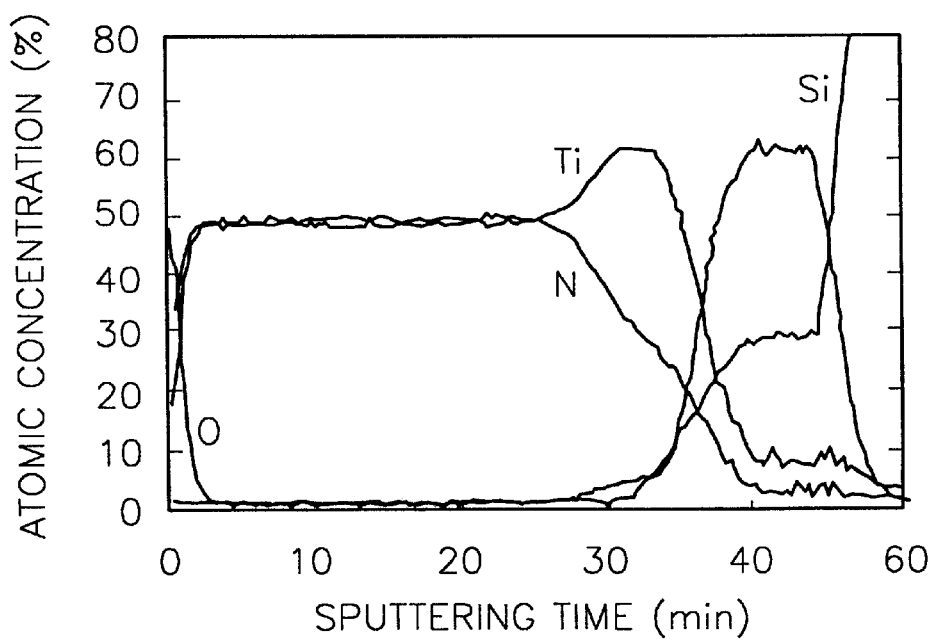
Figure 15:
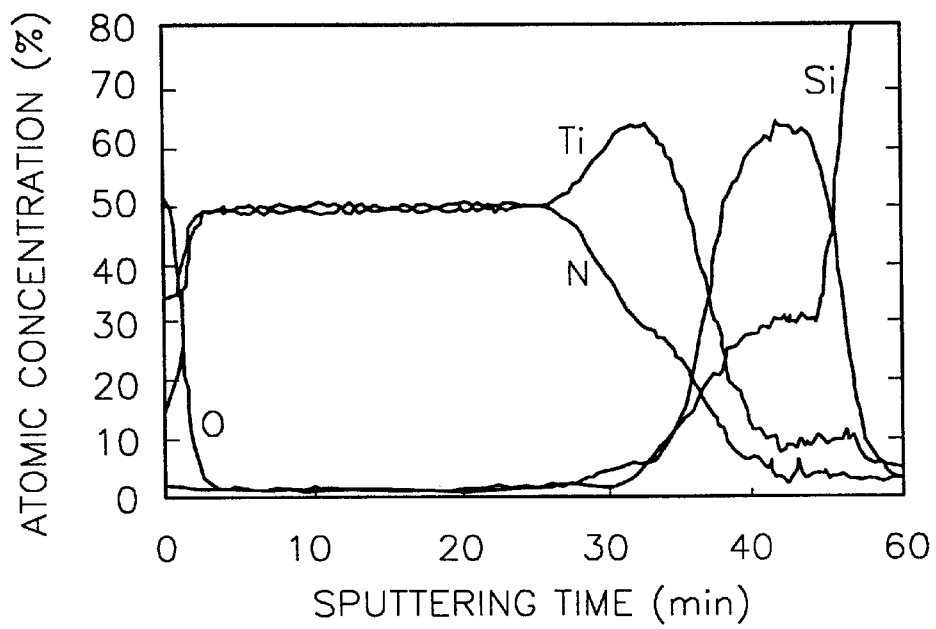
Figure 16:
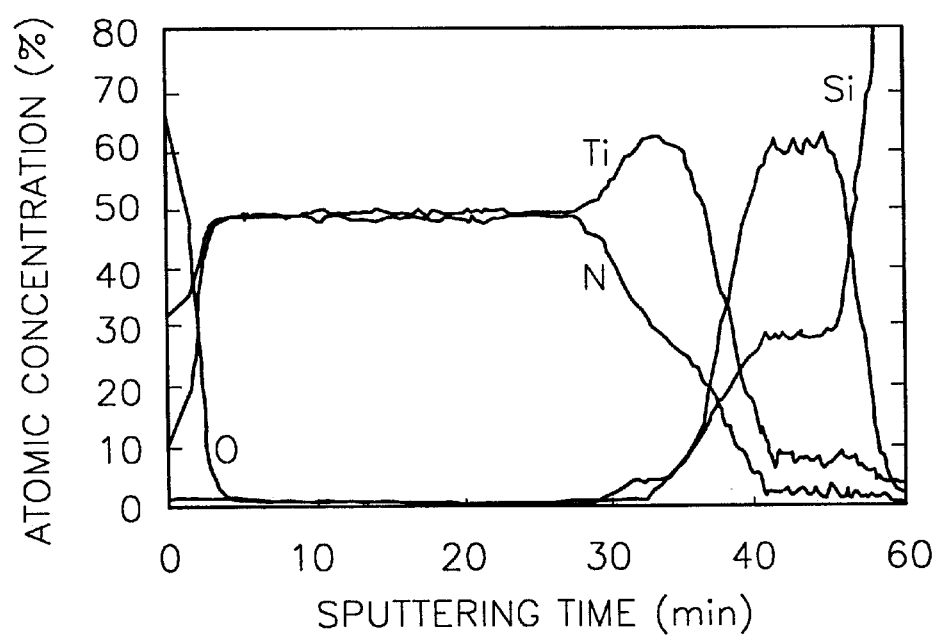
Figure 17:
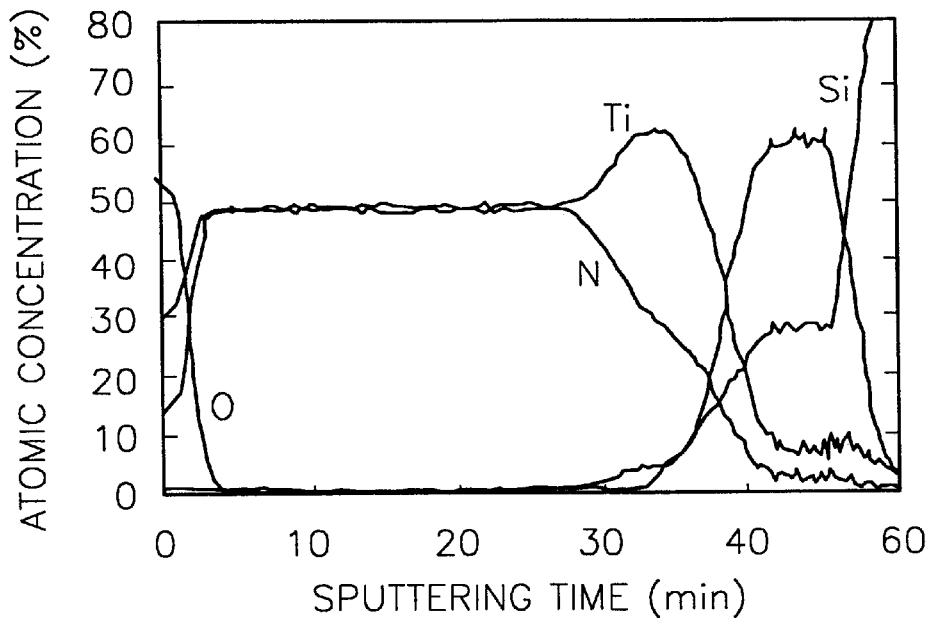
Figure 18:
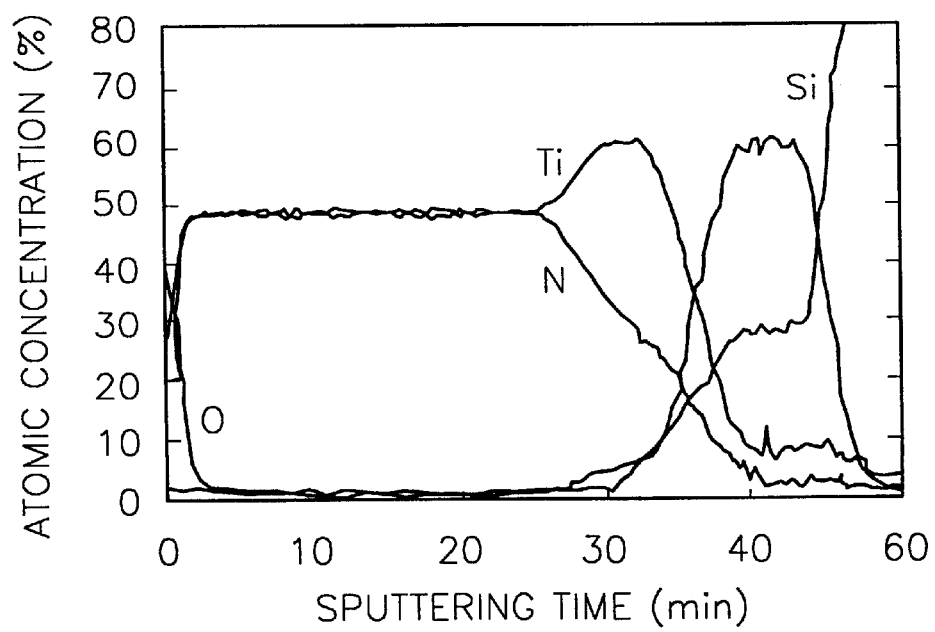
FIG. 18 is an AES graph of the reference sample of FIG. 6.

As can be seen from Table 2 and FIG. 6, the R.I. ratio of the TiN film which has not passed the annealing was the lowest at 1.82. As shown in the cases of samples 1, 4 and 5, the R.I ratio increases as the oxygen flow time increases. Meanwhile, in the cases of samples 1, 2 and 3, the R.I. ratio increases with the oxygen flow rate. Regarding the change in the R.I. ratio, the oxygen flow time has more effect on the R.I. ratio than the oxygen flow rate. This is because the number of oxygen atoms participating in the reaction with the TiN film for a predetermined time is constant, and the reaction occurs in proportion to the reaction time after the oxygen is saturated in a reaction tube of the furnace.

XRD Analysis

An XRD analysis was performed on the six samples which had passed through the annealing under the conditions of Table 1, and the results are shown in Table 3, and FIGS. 7 through 12. FIGS. 7 through 12 are the results from the XRD analysis on the samples 1 through 5 and the reference sample, respectively.

TABLE 3

| | sample | | | | | | | | |
|---|---|---|---|---|---|---|---|---|---|
| | 1 | | | 2 | | | 3 | | |
| | d | 2θ | I(CPS) | d | 2θ | I(CPS) | d | 2θ | I(CPS) |
| TiN (111) | 2.4302 | 36.960 | 3841 | 2.4327 | 36.920 | 4095 | 2.4314 | 36.940 | 3986 |
| Ti (011) | 2.2849 | 39.560 | 825 | 2.2784 | 39.520 | 847 | 2.2840 | 39.420 | 811 |
| | sample | | | | | | | | |
| | 4 | | | 5 | | | reference sample | | |
| | d | 2θ | I(CPS) | d | 2θ | I(CPS) | d | 2θ | I(CPS) |
| TiN (111) | 2.4314 | 36.960 | 3841 | 2.4289 | 36.980 | 4095 | 2.4289 | 36.980 | 8539 |
| Ti (011) | 2.2773 | 39.540 | 812 | 2.2784 | 39.520 | 532 | 2.2840 | 39.420 | 277 |

As can be seen from the results of the XRD analysis, the reference sample which had not passed the oxygen-annealing, and the samples 1 through 5 which had passed the oxygen-annealing, are different in two respects. First, the intensity of a TiN (111) peak of the samples 1 through 5 range between 3800 and 4100 while that of the reference sample is 8539. That is, the intensity of the TiN (111) peak which has passed the oxygen-annealing decreases to half that of the TiN (111) without performing the oxygen-annealing. Second, the intensity of a Ti(011) peak of the samples 1 through 5 ranges between 500 and 850, while that of the reference sample is 277 and the peak width thereof is slightly wider.

The reason why the TiN (111) peaks of the samples 1 through 5 which passed the oxygen-annealing are lower is because the thickness of the TiN film is decreased by a reaction between TiN and oxygen, and the reaction product causes interference by the X-ray diffraction. Also, as can be seen in FIGS. 7 through 11 where no peak other then the TiN and Ti peaks is shown, it can be deduced that the product of the reaction between TiN and oxygen is amorphous. Meanwhile, a lattice constant of the TiN (111) peak was nearly the same over all the samples. Thus, it can be seen that the densification of the TiN (111) film is not furthered after a predetermined time of annealing.

Therefore, the following is concluded from the XRD analysis. The oxygen-annealing does not affect the texture characteristics of the TiN film. However, an amorphous film of $Ti_xN_yO_z$ is formed through the reaction of oxygen and TiN film.

AES Analysis

An AES analysis was performed on the six samples which had passed through the annealing under the conditions of Table 1, and the results are shown in Table 4 and FIGS. 13 through 18. Here, for the AES analysis, a thermal oxide film was formed to a thickness of 1000 Å on the semiconductor substrate before the Ti film and the TiN film are formed. FIGS. 13 through 18 are the results of the AES analysis on the samples 1 through 5 and the reference sample, respectively.

TABLE 4

| sample | 1 | 2 | 3 | 4 | 5 | reference sample |
|---|---|---|---|---|---|---|
| Cs (%) | 50 | 53 | 51 | 52 | 53 | 51 |
| Xj1 (min) | 0.89 | 1.00 | 1.11 | 1.11 | 1.44 | 0.78 |
| Xj2 (min) | 2.50 | 2.67 | 3.30 | 2.83 | 3.61 | 2.50 |
| Xj3 (min) | 25.00 | 25.56 | 26.11 | 26.94 | 26.11 | 25.28 |

In Table 4, Cs represents atomic concentration (%) of oxygen on the surface of the TiN film, Xj1 represents sputtering time in minutes when Cs decreases by 1/e, Xj2 represents sputtering time in minutes when Cs is the same as oxygen concentration in bulk TiN film, and Xj3 represents sputtering time in minutes when the bulk TiN film becomes sufficient in Ti concentration, respectively.

Regardless of the oxygen-annealing time and the oxygen flow rate, the Cs value was nearly the same over all the samples. By comparing the samples 1, 4 and 5 and the reference sample, it can been known that Xj1 and Xj2 increase as the oxygen flow time increases. Also, in the case of the samples 1, 2 and 3 and the reference sample, Xj1 and Xj2 both increase as the oxygen flow rate increases.

That is, it can be seen that the oxygen-annealing increases oxygen concentration near the surface of the TiN film. For example, the oxygen concentrations of the reference sample and the sample 5, based on the time Xj2, can be calculated as follows. The reference sample is filled with oxygen from the surface of the TiN film to 100 Å depth while the sample 5 is filled with oxygen from the surface of the TiN film to 130 Å depth. Thus, compared with a conventional TiN film which is annealed under the nitrogen atmosphere, the oxygen distribution region of the TiN film of the present invention, which has passed the oxygen-annealing, is extended by approximately 30 Å, thereby improving the characteristics of the TiN film as a barrier.

Also, from the rates of change of Xj1 and Xj2, it can be seen that the oxygen flow time (see the results of the samples 1, 4 and 5 and the reference sample) has more effect on the increase of the oxygen concentration than the oxygen flow rate (see the results of the samples 1, 2 and 3 and the reference sample). Thus, preferably, the oxygen distribution depth is controlled by the oxygen flow time, and the furnace is saturated by flowing the oxygen at 100 sccm or more so as to evenly perform the oxygen-annealing regardless of the loading position of the substrate on which the TiN film is formed within a batch type furnace.

Leakage Current Measurement

After a plurality of semiconductor substrates are pretreated in a mixed solution containing hydroboric acid solution and hydrofluoric acid solution, a Ti film and a TiN film were deposited on the semiconductor substrate to 300 Å thickness and 500 Å thickness, respectively, by sputtering. The plurality of semiconductor substrates were classified into three groups, and then each group was annealed under the different conditions as shown in Table 5.

TABLE 5

| sample | 1 | 2 | reference sample |
|---|---|---|---|
| total annealing time (min) | 70 | 75 | 70 |
| oxygen flow time (min) | 5 | 10 | 0 |

After the annealing under the conditions of Table 5, leakage current was measured at eighty-three points on each semiconductor substrate, between a metal and a $P^+$ contact region. The device was evaluated as a failure at $10^{-8}$ A or more leakage current, and the results are shown in Table 6

TABLE 6

| sample | 1 | 4 | reference sample |
|---|---|---|---|
| leakage current occurrence rate (%) | 2.4 | 1.2 | 26.2 |

As shown in Table 6, the oxygen-annealing further decreases the occurrence of high leakage current, compared with the reference sample having had no oxygen-annealing. Also, it can be known that the leakage current occurrence decreases as the oxygen flow time increases.

TEM

After the oxygen-annealing, the TEM was performed on the sample 5 of Table 1. As a result of the TEM, it is observed that an amorphous film having a 70 Å thickness, regarded as a $Ti_xN_yO_z$ film, is formed on the surface of TiN film of the sample 5 toward the substrate.

Conclusion

According to the present invention, after annealing a barrier metal film, in-situ oxygen-annealing is immediately performed. By performing such oxygen-annealing during the general annealing process, an amorphous oxide film is formed at a predetermined depth from the surface of the metal film, while no oxygen is diffused into the inside of the barrier metal film. The amorphous oxide film formed on the surface of the barrier metal film acts as a diffusion barrier film against the interconnection film formed on the barrier metal film. Thus, junction-spike caused by the diffusion of the interconnection material into the barrier metal film can be effectively prevented.

Although preferred embodiments of the present invention have been described in detail herein above, it should be clearly understood that many variations and/or modifications of the basic inventive concepts taught herein, which may appear to those skilled in the art, will still fall within the spirit and scope of the present invention as defined in the appended claims and their equivalents.

What is claimed is:

1. A method of manufacturing a barrier metal film of a semiconductor device, comprising:

forming a barrier metal film on a semiconductor substrate;

annealing the barrier metal film;

in-situ oxygen-annealing immediately after said annealing, said in-situ oxygen annealing including providing oxygen for a predetermined time, the predetermined time being short enough that a contact resistance of the barrier metal film stays below an allowable maximum and long enough to form an oxide film as a diffusion barrier film on a surface of the barrier metal film; and nitrogen annealing after said in-situ oxygen annealing, the oxygen-annealed barrier metal film under an oxygen free atmosphere.

2. The method of claim 1, wherein said annealing includes annealing under a nitrogen atmosphere.

3. The method of claim 1, wherein the predetermined time is 5~20 minutes.

4. The method of claim 1, wherein said annealing and said in-situ oxygen annealing are performed in a batch type furnace.

5. The method of claim 4, wherein said in-situ oxygen annealing is performed by flowing oxygen at a predetermined flow rate which allows even oxygen-annealing regardless of the loading position of the semiconductor substrate within the furnace.

6. The method of claim 5, wherein the predetermined flow rate is at least 100 sccm.

7. The method of claim 1, wherein the barrier metal film is a titanium nitride (TiN) film.

8. A method of manufacturing a metal interconnection film of a semiconductor device, comprising:

forming a contact hole which exposes an impurity region formed on a semiconductor substrate;

forming a barrier metal film in the contact hole;

annealing the barrier metal film;

in-situ oxygen-annealing immediately after said annealing, said in-situ oxygen annealing including providing oxygen for a predetermined time, the predetermined time being short enough that a contact resistance of the barrier metal film stays below an allowable maximum and long enough to form an oxide film as a diffusion barrier film on a surface of the barrier metal film;

nitrogen annealing, after said in-situ oxygen annealing, the oxygen-annealed barrier metal film under an oxygen free atmosphere; and forming an interconnection film on the oxygen-annealed barrier metal film.

9. The method of claim 8, further comprising forming an ohmic contact metal film in the contact hole before said forming a barrier metal film.

10. The method of claim 8, wherein the barrier metal film is a titanium nitride (TiN) film, and the interconnection film is an aluminum (Al) film.

11. The method of claim 8, wherein said annealing includes performing annealing under a nitrogen atmosphere.

12. The method of claim 8, wherein said annealing and said in-situ oxygen annealing are performed in a batch type furnace.

13. The method of claim 12, wherein said in-situ oxygen annealing includes supplying oxygen at a predetermined flow rate which allows even oxygen-annealing regardless of the loading position of the semiconductor substrate within the furnace.

* * * * *